United States Patent
Lee

[19]

[11] Patent Number: 6,108,207
[45] Date of Patent: Aug. 22, 2000

[54] CLIP FOR HEAT SINK

[75] Inventor: Richard Lee, Taipei, Taiwan

[73] Assignee: Foxconn Precision Components Co., Ltd., Taipei Hsien, Taiwan

[21] Appl. No.: 09/416,866

[22] Filed: Oct. 13, 1999

[30] Foreign Application Priority Data

Jun. 29, 1999 [TW] Taiwan ................................ 88210757

[51] Int. Cl.⁷ ................................................ H05K 7/20
[52] U.S. Cl. .......................... 361/704; 361/704; 361/707; 257/718; 257/719; 165/80.2; 165/80.3; 174/16.3; 24/625; 248/505
[58] Field of Search .................................. 361/704, 707, 361/709, 710, 717–719; 24/625; 257/718, 719, 726, 727; 174/16.3; 165/80.2, 80.3; 248/505

[56] References Cited

U.S. PATENT DOCUMENTS

| | | | |
|---|---|---|---|
| 5,241,453 | 8/1993 | Bright et al. | 361/704 |
| 5,280,409 | 1/1994 | Selna et al. | 361/720 |
| 5,486,981 | 1/1996 | Blomquist | 361/704 |
| 5,602,719 | 2/1997 | Kinion | 361/704 |
| 5,933,325 | 8/1999 | Hou | 361/704 |
| 5,933,326 | 8/1999 | Lee et al. | 361/704 |

*Primary Examiner*—Leo P. Picard
*Assistant Examiner*—Boris L. Chervinsky
*Attorney, Agent, or Firm*—Wei Te Chung

[57] ABSTRACT

An integrally formed clip comprises first and second engaging legs for engaging with a socket, a folded first squeezing portion for exerting an inward squeezing force, a folded second squeezing portion opposing the first squeezing portion for exerting an inward squeezing force and a downward pressing force, and a curved spring portion. The first squeezing portion includes an outside face upwardly extending from the first engaging leg and an inside face connected with the spring portion. The second squeezing portion connects to an opposite end of the spring portion and is L-shaped, comprising a vertical first folded section accepting an inward squeezing force and a horizontal second folded section for accepting a downward pressing force. The second engaging leg depends downward from the second operation section. Alternatively, the first squeezing portion can be identical to the second squeezing portion.

12 Claims, 4 Drawing Sheets

CLIP FOR HEAT SINK

BACKGROUND OF THE INVENTION

1. Field of the Invention

The present invention relates to a clip, and more particularly to a clip for conductively attaching a heat sink to a top surface of a CPU while can be easily manipulated for assembly or disassembly of the heat sink.

2. Description of Prior Art

As heat generating components in a computer, such as CPUs and chips, contain many circuitry and operate at high speeds, greater amounts of heat are generated, which must be dissipated for reliable operation. A heat sink made from a heat conductive material, such as aluminum, is commonly used to dissipate the heat generated by a heat generating component. The heat sink is retained in direct contact with the heat generating component to dissipate the heat into the surrounding environment.

The heat sink is usually attached to a heat generating component by a clip. A conventional clip 110 integrally made from metal is shown in FIG. 5. The clip 110 includes a first end portion 112 with a first aperture 113 defined therein, an opposite second end portion 118 with a second aperture 117 defined therein, and a curved spring portion 114 interconnecting the first and the second end portions 112 and 118. The first and the second apertures 113 and 117 are adapted for respectively receiving a first and a second catches projecting from opposite ends of a socket (not shown) on which a CPU (not shown) is electrically mounted. The spring portion 114 is curved toward a base plate of a heat sink (not shown) and is partially flattened to abut against the base plate of the heat sink thereby resiliently retaining the heat sink in intimate contact with a top surface of the CPU which is coupled to the socket. The second end portion 118 of the clip 110 further includes an operation section 116 upwardly and horizontally extending therefrom toward the first end portion 112.

In assembly, since only one operation section 116 is provided for the clip 110, an auxiliary tool is required to engage the first aperture 113 with the first catch of the socket. The operation section 116 is then pressed to engage the second aperture 117 with the second catch of the socket. Alternatively, the clip 110 can be attached to the socket using two hands. However, the assembly operation for this clip 110 is inconvenient and laborious. The procedure for unlocking the clip 110 from the socket meets the similar problems.

Another conventional clip 120 is shown in FIG. 6. The clip 120 includes a spring member 130 and an operation member 140, which are separately manufactured and assembled together later on. The spring member 130 comprises a downwardly extending first latching portion 132 with a first aperture 133 defined therein, an intermediate curved spring portion 134, and a bifurcated end portion 136 for connecting with the operation member 140. The operation member 140 comprises a second latching portion 142 with a second aperture 143 defined therein, a slot 144 for engaging with the bifurcated end portion 136 of the spring member 130, and an squeezing portion 146 extending toward the spring member 130.

Since the spring member 130 and the operation member 140 are separately manufactured, assembly and disassembly of the clip 120 to and from a socket (not shown) are facilitated. However, the retention force of the clip 120 is insufficient to firmly retain a heat sink (not shown) on a CPU (not shown) thereby adversely affecting the heat dissipating performance of the heat sink. In addition, the second aperture 143 of the operation member 140 may disengage from a corresponding catch (not shown) of the socket, and the bifurcated end portion 136 of the spring member 130 has a tendency to break away from the slot 144 of the operation member 140 under shock or vibration.

U.S. Pat. Nos. 5,602,719, 5,600,540, Taiwan Patent Application Nos. 85211135 and 85214941 disclose other conventional clips with the similar problems to those described above.

The present invention is directed at solving the aforesaid problems by providing a clip for facilitating assembly and disassembly to and from a socket while providing sufficient retention force between a heat sink and a CPU.

SUMMARY OF THE INVENTION

Accordingly, an object of the present invention is to provide a clip for facilitating assembly and disassembly to and from a socket while providing sufficient retention force between a heat sink and a CPU coupled to the socket.

In order to achieve the object set forth, a clip of the present invention is integrally formed by stamping and bending a metal sheet. The clip includes a pair of first and second engaging legs, a folded first squeezing portion for applying an inward squeezing force, a folded second squeezing portion opposing the first squeezing portion for applying an inward squeezing force and a downward pressing force, and a curved spring portion for pressing a heat sink against a CPU which is coupled to a socket. The first and the second engaging legs respectively define first and second apertures for engaging with opposite first and second catches of the socket.

The first squeezing portion includes a folded section upwardly extending from the first engaging leg, the inward side of the folded section bending horizontally at a lower end to connect with the spring portion. The second squeezing portion is L-shaped and includes a vertical first folded section adapted to be inwardly squeezed in conjunction with the folded section of the first squeezing portion. The second squeezing portion also includes a horizontal second folded section adapted to take a downward pressing force. Alternatively, the first squeezing portion can be identical to the second squeezing portion.

In assembly, the first aperture of the first engaging leg is first engaged with the first catch of the socket. The second folded section of the second squeezing portion is then downwardly pressed to engage the second aperture of the second engaging leg with the second catch of the socket.

In disassembly, the second folded section of the second squeezing portion is downwardly pressed, and the first squeezing portion and the first folded section of the second squeezing portion are successively squeezed inward. Thus, the first and the second engaging legs move away from each other, disengaging the apertures from the catches of the socket. Such downward pressing and inward squeezing operations can be performed by the user's thumb and a finger without the help of an external tool.

Other objects, advantages and novel features of the invention will become more apparent from the following detailed description when taken in conjunction with the accompanying drawings.

DETAILED DESCRIPTION OF THE EMBODIMENTS

Figure 1:
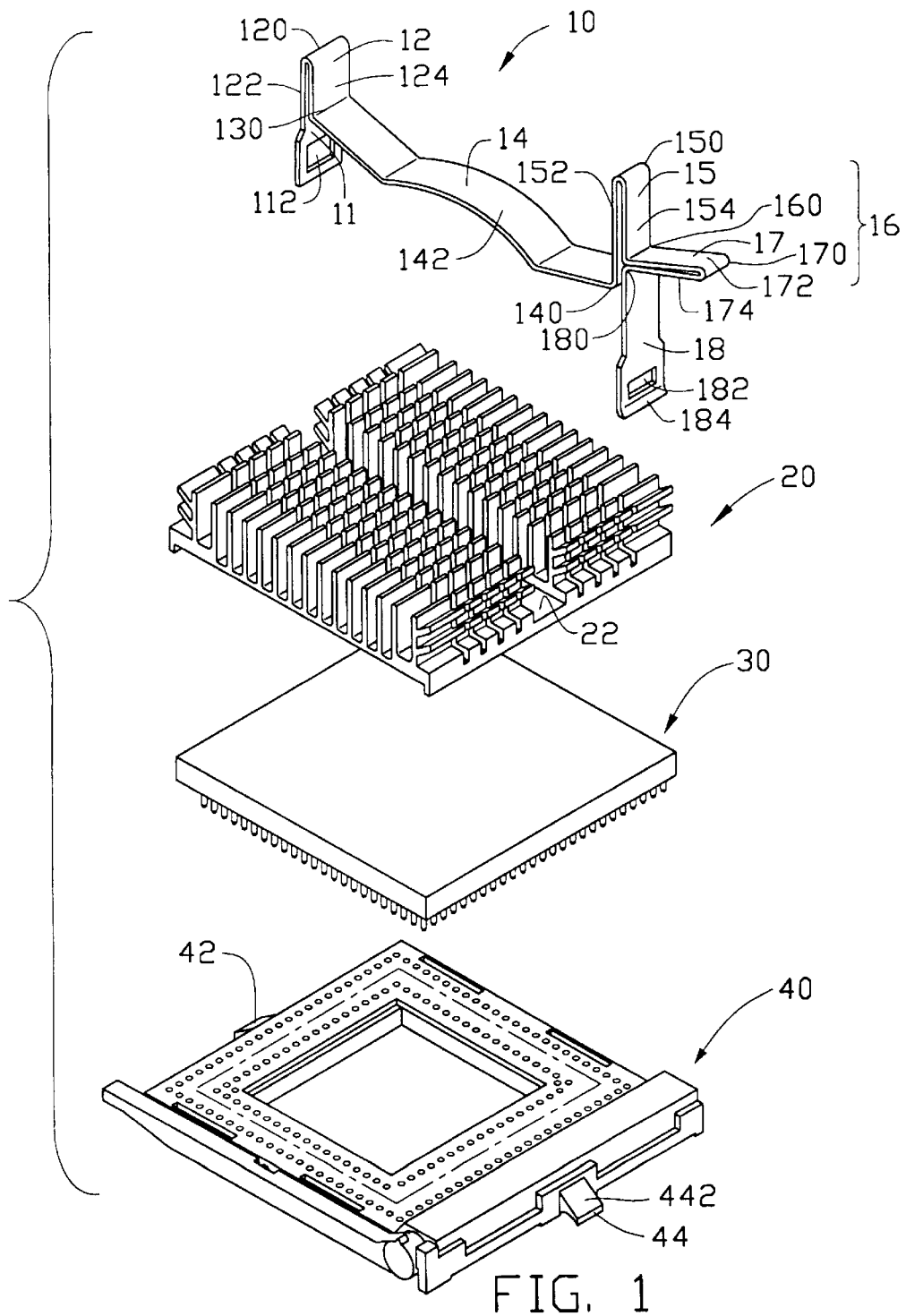
FIG. 1 is an exploded view of a CPU assembly including a clip in accordance with a first embodiment of the present invention, a heat sink, a CPU and a socket.

For facilitating understanding, like components are designated by like reference numerals throughout the various embodiments of the invention as shown in the various drawing figures.

Reference will now be made to the drawing figures to describe the present invention in detail.

Referring to FIG. 1, a CPU assembly includes a clip 10 in accordance with a first embodiment of the present invention, a heat sink 20, a CPU 30 and a socket 40. The clip 10 is integrally formed by stamping and bending a metal sheet. The clip 10 includes a first engaging leg 11, a folded first squeezing portion 12 upwardly extending from the first engaging leg 11, an L-shaped second squeezing portion 16 opposing the first squeezing portion 12, a curved spring portion 14 interconnecting the first and the second squeezing portions 12 and 16, and a second engaging leg 18 downwardly extending from the second squeezing portion 16.

A first and a second apertures 112 and 182 are defined in lower ends of the first and the second engaging legs 11 and 18 for receiving outwardly projecting first and second catches 42 and 44 of the socket 40, respectively. The second engaging leg 18 further has an outwardly extending toe 184 at a free end thereof.

The curved spring portion 14 is received in a central channel 22 of the heat sink 20 which has a width substantially equal to the width of the spring portion 14. The spring portion 14 has a central arcuate section 142 for providing resiliency thereof to ensure an intimate contact between the spring portion 14 and the heat sink 20.

The first squeezing portion 12 upwardly extends from the first engaging leg 11 and comprises an outside face 122 opposite an inside face 124, the two faces being connected along a first bend 120 at a top end thereof. The inside face 124 of the first squeezing portion 12 connects to the spring portion 14 at a second bend 130.

The L-shaped second squeezing portion 16 includes a vertical first folded section 15 and a horizontal second folded section 17. The first folded section 15 upwardly extends from the curved spring section 14 and comprises an inward extension 152 opposite an outward extension 154, the two extensions being connected along a fourth bend 150 at a top end thereof in similar fashion to that of the first squeezing portion 12. The inward extension 152 of the first folded section 15 is opposite the inside face 124 of the first squeezing portion 12. The first folded section 15 in conjunction with the first squeezing portion 12 is adapted to accept an inward squeezing force simultaneously directed against the outward extension 154 and the outside face 122. The first folded section 15 connects to the spring section 14 at a third bend 140. The second folded section 17 depends outwardly and perpendicular to the first folded section 15 and comprises an upward face 172 opposite a downward face 174, the two faces being connected along a sixth bend 170 at a distal end thereof in similar fashion to that of the first squeezing portion 12. The upward face 172 connects to the outward extension 154 along a fifth bend 160. The downward face 174 connects to the second engaging leg 18 along a seventh bend 180.

Figure 2:
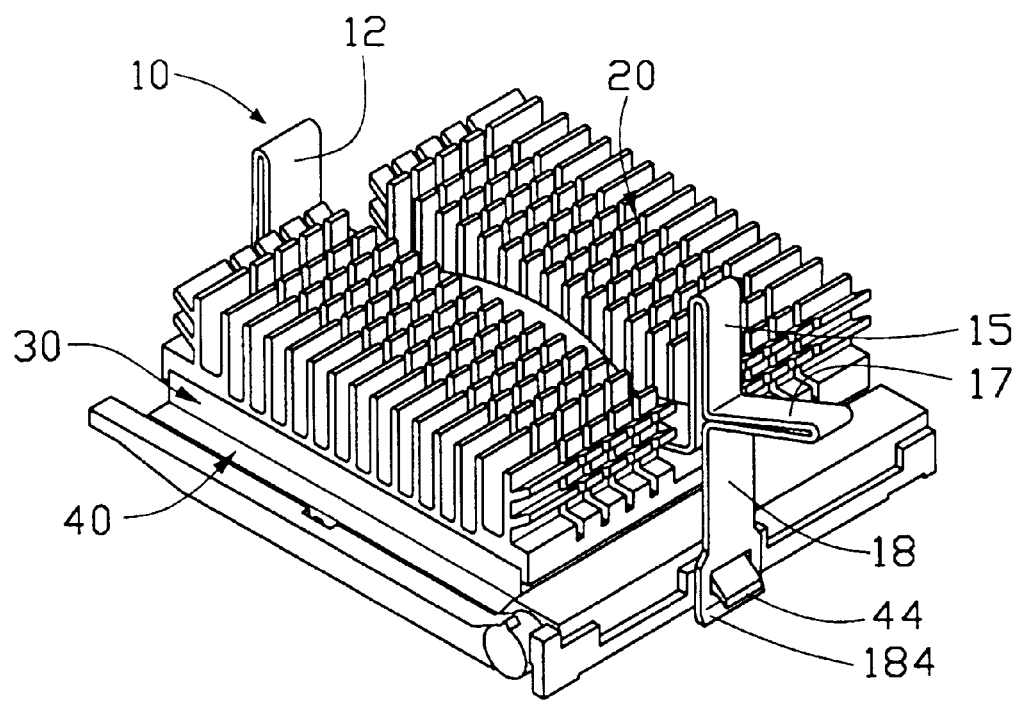
FIG. 2 is an assembled view of FIG. 1.

In assembly, the CPU 30 is first lowered onto and connected to the socket 40, and the heat sink 20 is then positioned over the CPU 30. The clip 10 is finally received within the channel 22 of the heat sink 20 in an oblique manner to engage the first aperture 112 of the first engaging leg 11 with the first catch 42 of the socket 40. The second folded section 17 of the clip 10 is downwardly pressed to move the second engaging leg 18 toward the second catch 44 of the socket 40. The second aperture 182 of the clip 10 is guided into engagement with the second catch 44 of the socket 40 via the cooperation between the toe 184 of the second engaging leg 18 and an inclined outer surface 442 of the second catch 44 of the socket 40. Thus, the clip 10 is securely attached to the socket 40 whereby the spring portion 14 is fitted into the channel 22 of the heat sink 20 and resiliently abuts against the heat sink 20 to retain the heat sink 20 on the CPU 30, as shown in FIG. 2.

Figure 3:
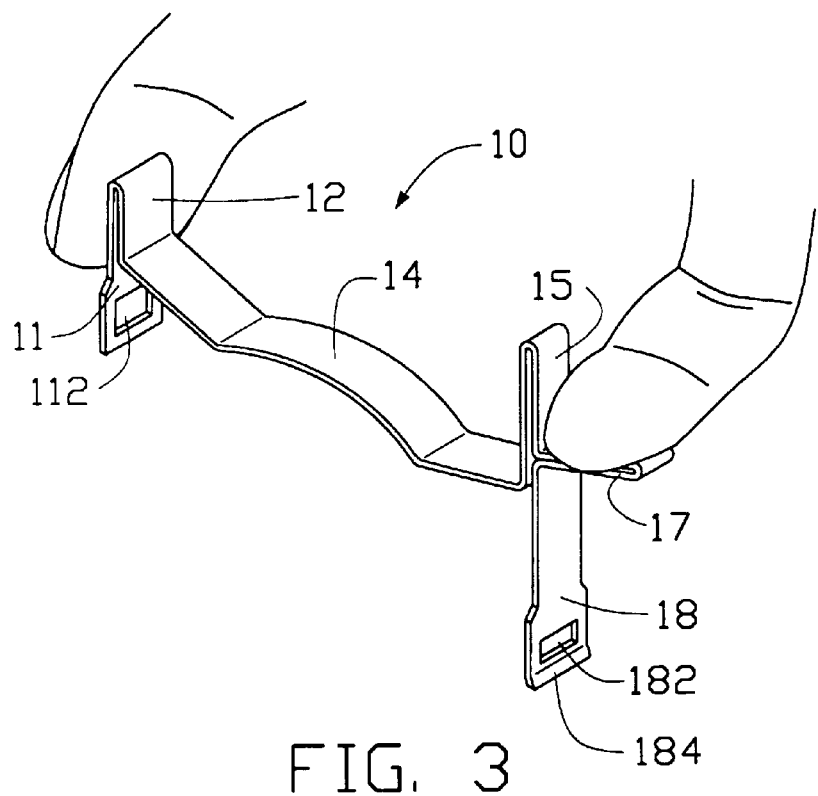
FIG. 3 is a schematic view illustrating how to disassemble the clip from the socket of FIG. 1.

In disassembly, the second folded section 17 of the second squeezing portion 16 of the clip 10 is downwardly pressed, and the first squeezing portion 12 and the first folded section 15 of the second squeezing portion 16 are successively squeezed inward. Thus, the first and the second engaging legs 11 and 18 move away from each other, disengaging from the corresponding first and second catches 42 and 44 of the socket 40. As illustrated in FIG. 3, such downward pressing and inward squeezing operations can be performed by the user's thumb and a finger without use of an external tool.

Figure 4:
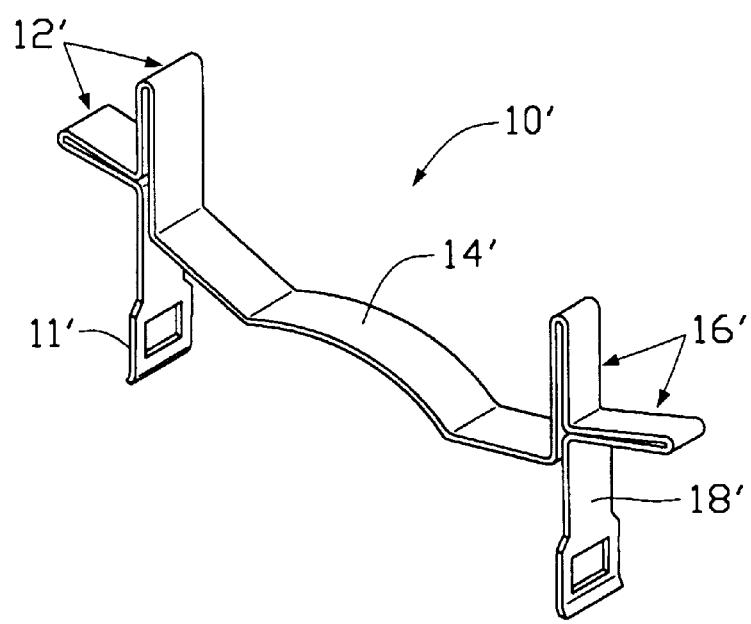
FIG. 4 is a perspective view of a clip in accordance with a second embodiment of the present invention.
Figure 5:
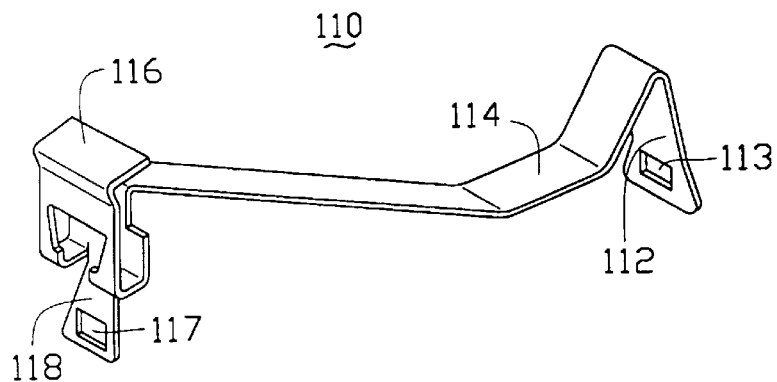
FIG. 5 is a perspective view of a conventional clip.
Figure 6:
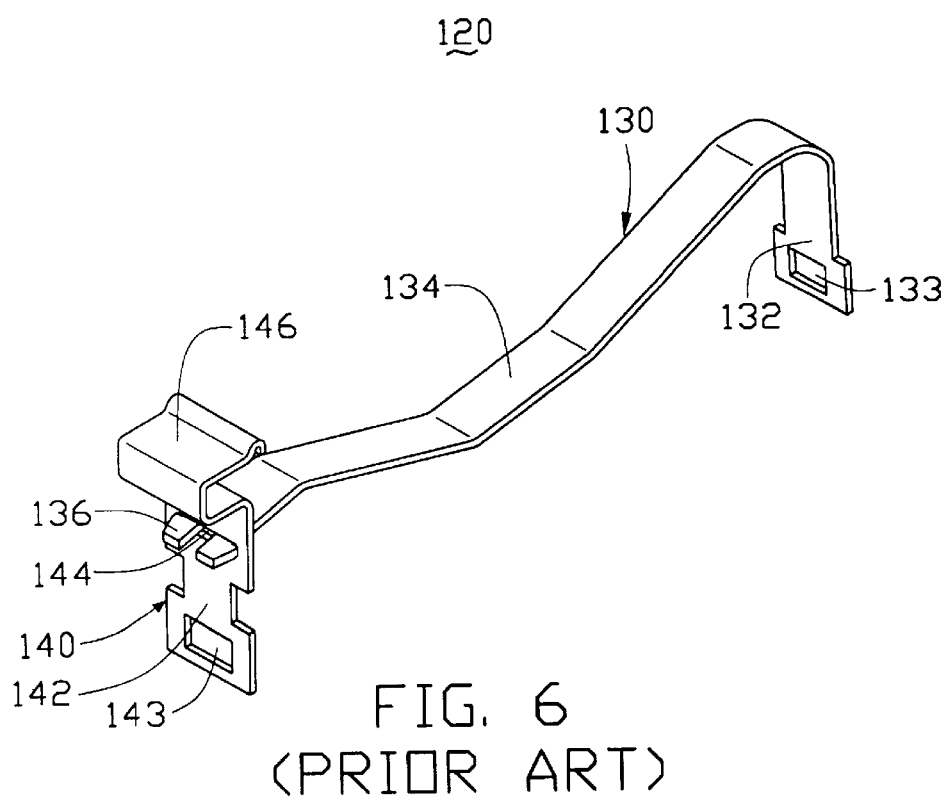
FIG. 6 is a perspective view of another conventional clip.

FIG. 4 shows a clip 10' in accordance with a second embodiment of the present invention. The clip 10' includes a first and a second squeezing portions 12' and 16' which are identical to the second squeezing portion 16 of the clip 10 of the first embodiment. A first and a second engaging legs 11' and 18' of the clip 10' are also identical to the second engaging leg 18 of the clip 10 of the first embodiment. With this design, assembly and disassembly of the clip 10' to and from the socket 40 is also facilitated.

According to the present invention, since the clip 10, 10' is constructed as one integral piece, the retention force provided by the spring portion 14, 14' is sufficient enough to securely retain the heat sink 20 on the CPU 30. In addition, assembly and disassembly of the clip 10, 10' to and from the socket 40, which can be performed using one hand and without using an external tool, is facilitated due to the provision of the first and the second squeezing portions 12, 12' and 16, 16'.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

I claim:

1. An integrally formed clip for retaining a heat sink to a top face of a CPU mounted on a socket, the clip comprising:

a curved spring portion adapted for pressing the heat sink against the CPU;

a folded first squeezing portion connected to one end of the curved spring portion and adapted for accepting an inward squeezing force;

a first engaging leg downwardly extending from the folded first squeezing portion for engaging with one end of a socket;

a folded second squeezing portion connected to another end of the curved spring portion and adapted for accepting a downward pressing force and a successive inward squeezing force in conjunction with the first squeezing portion; and a second engaging leg downwardly extending from the folded second squeezing portion for engaging with another end of the socket.

2. The clip as described in claim 1, wherein the first squeezing portion includes an outside face upwardly extending from the first engaging leg and an opposite inside face connected with one end of the spring portion.

3. The clip as described in claim 2, wherein the outside and inside faces are connected at a top end of the first squeezing portion.

4. The clip as described in claim 2, wherein the second squeezing portion is L-shaped and includes a vertical first folded section connected with the spring portion for accepting the inward squeezing force and a horizontal second folded section perpendicular to the first folded section for accepting the downward pressing force.

5. The clip as described in claim 4, wherein the first folded section has an inward extension upwardly extending from another end of the spring portion and an outward extension connected with the inward extension at a top end thereof, and wherein the second folded section has an upward face outwardly extending from the outward extension of the first folded section and an opposite downward face inwardly extending from the upward face to connect with the second engaging leg.

6. The clip as described in claim 4, wherein the second folded section of the second squeezing portion is formed at a level above the spring portion for facilitating a downward pressing operation.

7. The clip as described in claim 1, wherein each of the first and the second squeezing portions is L-shaped and includes a vertical first folded section connected with the spring portion for accepting an inward squeezing force and a horizontal second folded section perpendicular to the first folded section for accepting a downward pressing force.

8. The clip as described in claim 7, wherein the first folded section has an inward extension upwardly extending from another end of the spring portion and an outward extension connected with the inward extension at a top end thereof, and wherein the second folded section has an upward face outwardly extending from the outward extension of the first folded section and an opposite downward face inwardly extending from the upward face to connect with the second engaging leg.

9. The clip as described in claim 7, wherein the second folded section of each of the first and the second squeezing portions is formed at a level above the spring portion for facilitating a downward pressing operation.

10. The clip as described in claim 1, wherein the spring portion has a central arcuate section for providing sufficient resiliency to abut against the heat sink.

11. A clip for attaching a heat sink to a top face of a CPU mounted on a socket having opposite retaining catches, comprising:

a spring portion having a pressing face and first and second opposite ends;

a first engaging leg formed on said first end and having a first aperture for detachably engaging with one of said retaining catches;

a second engaging leg formed on said second end and having a second aperture for detachably engaging with the other retaining catch; and manipulating means formed on said clip for driving said first and second legs to move close or away from each other.

12. An electronic package assembly comprising:

a socket;

a CPU coupled to the socket;

a heat sink abutting against and positioned atop the CPU;

an integrally formed clip combining the socket, the CPU and the heat sink together, said clip including:

a curved spring portion extending across the heat sink and pressing the heat sink against the CPU;

a folded first squeezing portion connected to one end of the curved spring portion, said folded first squeezing portion including a vertical section integrally extending upwardly from said end of the squeezing portion and a horizontal section integrally extending outwardly from one end of said vertical section;

a first engaging leg downwardly extending from one end of said horizontal section with an opening latchably engaged with a catch of the socket; and a second engaging leg downwardly extending about the other end of the curved spring arm with another opening latchable engaged with another catch of the socket; wherein the horizontal section endures a downward pressing force and the vertical section endures an inward squeezing force when the clip is intended to be removed from the socket and the associated heat sink.

* * * * *